United States Patent [19]

Mori

[11] Patent Number: 4,682,331
[45] Date of Patent: Jul. 21, 1987

[54] LOGIC CIRCUIT WITH SELF-TEST

[75] Inventor: Shojiro Mori, Ageo, Japan

[73] Assignee: Kabushiki Kaisha Toshiba, Kawasaki, Japan

[21] Appl. No.: 662,142

[22] Filed: Oct. 18, 1984

[30] Foreign Application Priority Data

Oct. 20, 1983 [JP] Japan ................................ 58-196767

[51] Int. Cl.[4] ............................................. G01R 31/28
[52] U.S. Cl. .................................... 371/25; 324/73 R
[58] Field of Search ............................. 371/25, 21, 15; 324/73 R

[56] References Cited

U.S. PATENT DOCUMENTS

| | | | |
|---|---|---|---|
| 3,559,167 | 1/1971 | Carter et al. | 371/3 X |
| 3,783,254 | 1/1974 | Eichelberger | 364/700 |
| 4,001,818 | 1/1977 | Radichel et al. | 371/25 X |
| 4,176,258 | 11/1979 | Jackson | 371/25 X |
| 4,242,751 | 12/1980 | Henckels et al. | 371/26 |
| 4,271,515 | 6/1981 | Axtell, III et al. | 371/25 |
| 4,328,583 | 5/1982 | Stodola | 371/3 X |
| 4,412,327 | 10/1983 | Fox et al. | 371/25 X |
| 4,498,172 | 2/1985 | Bhavsar | 371/25 |
| 4,541,090 | 9/1985 | Shiragasawa | 371/21 |

OTHER PUBLICATIONS

LeBlanc, LOCST: A Built-In Self-Test Technique, IEEE Design & Test, Nov. 1984, pp. 45–52.
Sellers, Jr. et al., Error Detecting Logic for Digital Computers, McGraw-Hill Co., 1968, pp. 207–211.

Primary Examiner—Charles E. Atkinson
Attorney, Agent, or Firm—Finnegan, Henderson, Farabow, Garrett and Dunner

[57] ABSTRACT

A logic circuit according to this invention has a logic section. First input terminals of first to third EX OR gates are respectively connected to output terminals of preselected logic elements among the logic elements which constitute the logic section. Output terminals of the first and second EX OR gates are connected to second input terminals of the second and third EX OR gates. The functional test for this logic circuit is performed by inputting test pattern signals to the logic section and by comparing output signals of the logic section and an output signal of the third EX OR gate with the expected values.

20 Claims, 13 Drawing Figures

LOGIC CIRCUIT WITH SELF-TEST

BACKGROUND OF THE INVENTION

The present invention relates to an improvement in a logic circuit; and more particularly, it relates to a logic circuit which can easily perform its own functional test.

Figure 1:
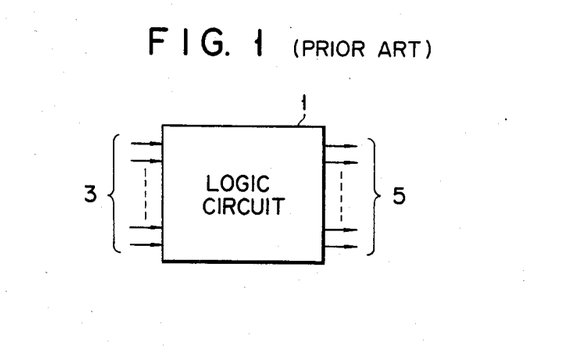
FIG. 1 is a block diagram of the functional test for a conventional logic circuit.

Generally, when an integrated circuit and the like is first installed, the functional test of the integrated circuit and the like is performed. For example, the functional test of a logic circuit 1 (as shown in FIG. 1) is ordinarily performed as follows. First, test pattern signals are input to a plurality of input terminals 3 of the logic circuit 1. Next, output signals are output from a plurality of output terminals 5 and compared with expected values which have been preliminarily prepared. When the output signals and expected values coincide, logic circuit 1 is deemed to be operating correctly. Conversely, when the output signals are expected values do not coincide, it is determined that the logic circuit 1 is malfunctioning.

The object of a functional test is to check whether or not a logic circuit works as is expected. The smaller the number of input test patterns which are required to check for all possible defects in the components of the logic circuit, the more efficient the functional test. The number of input test patterns required depends on the number of components which make up the logic circuit and their complexity. An increase in the number of output terminals, however, results in a decrease in the number of required input test patterns because defects in the logic components can be more easily detected.

Figure 2:
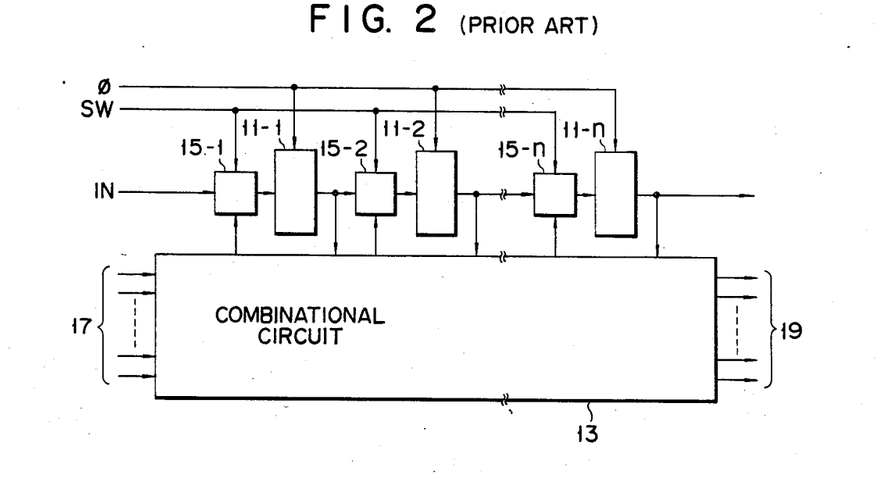
FIG. 2 is a block diagram of the conventional functional test of a sequential circuit.
Figure 3:
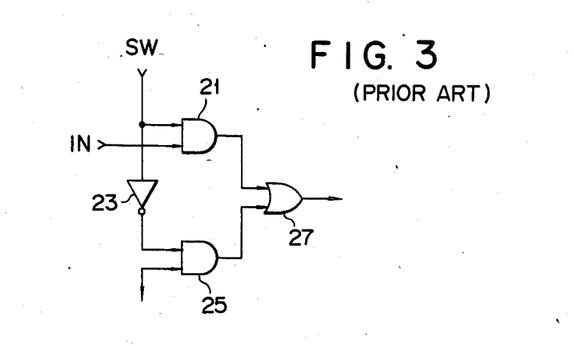
FIG. 3 is a circuit diagram of one of the changeover switches shown in FIG. 2.

Sequential circuits represents one class of logic circuits. Another class is combinational circuits, which, compared with sequential circuits, do not contain memory. A common method of testing sequential circuits is the scan-path method. FIG. 2 shows one of the logic circuits which may be used to implement the scan-path method. This circuit (FIG. 2) is a modification of the logic circuit shown in FIG. 7 of U.S. Pat. No. 3,783,254. Generally, a sequential circuit can be expressed as a combination of registers 11-1 to 11-n and a combinational circuit 13. The sequential circuit of FIG. 2 further comprises changeover switches 15-1 to 15-n. FIG. 3 shows one of these switches, e.g., the switch 15-1. As shown in the figure, a switch signal SW is supplied to the first input terminal of a 2-input AND gate 21. This signal SW is supplied via an inverter 23 to the first input terminal of a 2-input AND gate 25. A scan input signal IN is supplied to the second input terminal of the AND gate 21. The second input terminal of the AND gate 25 is connected to the combinational circuit 13. The output terminals of the AND gates 21 and 25 are coupled to the first and second input terminals of a 2-input OR gate 27, the output terminal of which is coupled to the register 11-1.

Since the other changeover switches 15-2 to 15-n have the same structure as the switch 15-1, the registers 11-1 to 11-n store the data provided by the combinational circuit 13 as long as the switch signal SW is at a low level. On the other hand, the registers 11-1 to 11-n operate as a shift register when the switch signal SW is at a high level. The scan-path method is performed as follows. Test pattern signals are input to a plurality of input terminals 17 of the combinational circuit 13. Output signals from output terminals 19 are compared with expected values which have already been prepared. The switch signal SW is switched so that the registers 11-1 to 11-n act as shift registers. A pulse signal $\phi$ is input to the registers 11-1 to 11-n to shift the contents of the registers. The contents of the respective registers 11-1 to 11-n are sequentially fetched at the output of register 11-n, and compared with the expected values.

In the case of the scan-path method, registers play a further role as additional output terminals. Since the operation of the combinational circuit becomes more easy to observe, the number of required test patterns which are input to the input terminals 17 can be reduced.

According to the ordinary method for the functional test, the number of required test patterns increases as logic circuit 1 becomes more complicated. It raises a problem in that it requires a long time to perform the full functional test.

On the other hand, according to the scan-path method, the number of required test patterns can be reduced by using registers as output terminals. However, in the scan-path method, observable nodes inside a logic circuit are limited by the number of registers 11-1 to 11-n. As a result, when an increase in the number of observable logic nodes is desired, it is necessary to add registers to the logic circuit. A register has a larger number of constituent elements than an ordinary gate circuit. Thus, this method has a drawback in that the size of the whole circuit becomes large. Further, an increase of the number of registers 11-1 to 11-n increases the time needed to retrieve the contents of those registers and perform the functional test.

With the recent high intergration and high density of semiconductor devices, the functional test is becoming more and more important. At the same time, there is a problem in that it takes a longer time to perform a functional test on such density integration devices.

SUMMARY OF THE INVENTION

In consideration of the above-mentioned circumstances, the object of this invention is to provide a logic circuit which can easily and accurately perform its functional test in a short period of time.

The above and other objects are achieved by a logic circuit comprising a logic section for receiving an input signal and for providing a output signal, the logic section including a plurality of logic elements having corresponding input terminals and output terminals, the input terminals and the output terminals being interconnected to perform logic operations to generate a value for the output signal according to the value of the input signal; and a checking circuit for receiving a control signal and the values of said output terminals of selected logic elements, for logically combining the value of the control signal and the received values, and for generating an error detection signal having an expected value if each of the selected logic elements is operating correctly and an error value if at least one of the selected logic elements is operating incorrectly.

In a logic circuit with such an arrangement, by comparing the output signals of the checking circuit with the expected values, it is possible to check whether the output signals of the preselected logic elements are correct or not. The functional test of the logic section is performed by respectively comparing the output signals of the logic section and the output signals of the checking circuit with the expected values. Therefore, it is possible to remarkably reduce the number of required input test pattern signals to the logic section, thereby enabling the functional test of the logic section to be accurately performed in a short period of time. The logic elements in which failures are difficult to discover from the outside can be selected as the preselected logic elements. In such a case, it is possible to significantly decrease the number of input test pattern signals to the logic section. Thus, it is possible to greatly shorten the time needed to perform a functional test.

DETAILED DESCRIPTION OF THE PREFERRED EMBODIMENT

Figure 4A:
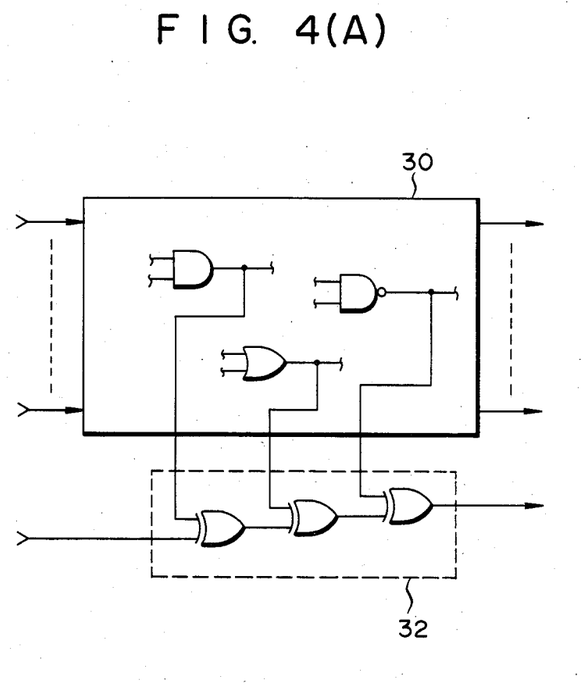
FIG. 4(A) is a circuit diagram showing the concept of the present invention.

FIG. 4(A) shows the idea of the present invention. As shown in this figure, three EX OR gates 32 are cascade-connected. The input terminals of these gates 32 are coupled to the output terminals of three preselected gates of a logic circuit 30 which comprises other gates of various types.

A logic circuit according to an embodiment of the invention will now be described with reference to FIG. 4(B).

Figure 4B:
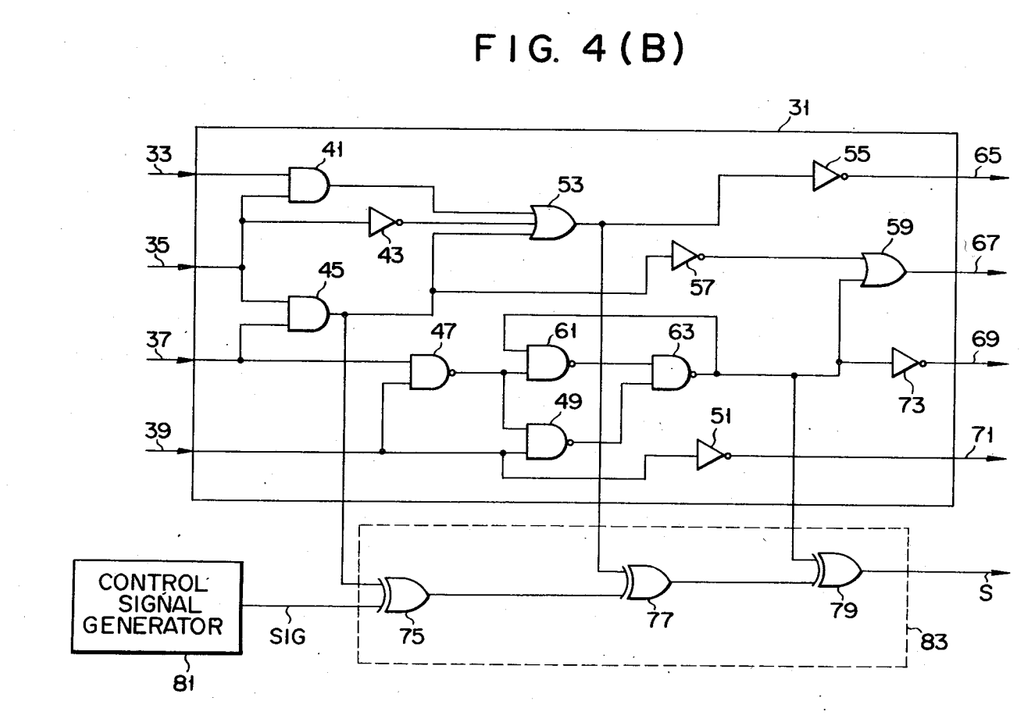
FIG. 4(B) is a circuit diagram showing one embodiment of the present invention.

In FIG. 4(B), a logic section 31 is comprised of various kinds of gates and registers, etc., and has a predetermined logic function. Further, it is provided with EX OR gates. The EX OR gates are connected in such a way that the output terminal of each of the EX OR gates is connected to one input terminal of the succeeding EX OR gates. The other input terminals of these EX OR gates are respectively connected to the output terminals of the preselected gates among the gates which comprise logic section 31. (The preselected gates are to be checked as to whether or not the output signals thereof are correct.) The more complex the logic section 31 is, the more useful the present invention is. For explanation, it is assumed that the logic section 31 in this embodiment is structured in the following manner. The logic section 31 has first to fourth input terminals 33, 35, 37, and 39. The first input terminal 33 is connected to a first input terminal of an AND gate 41. The second input terminal 35 is connected to a second input terminal of the AND gate 41, an inverter 43, and a first input terminal of an AND gate 45. The third input terminal 37 is connected to a second input terminal of the AND gate 45 and to a first input terminal of an NAND gate 47. The fourth input terminal 39 is connected to a second input terminal of the NAND gate 47, a second input terminal of the NAND gate 49, and an input terminal of an inverter 51. An output terminal of the AND gate 41, an output terminal of the inverter 43, and an output terminal of the AND gate 45 are connected to first, second and third input terminals of an OR gate 53, respectively. An output terminal of this OR gate 53 is connected to an input terminal of an inverter 55. The output terminal of the AND gate 45 is connected to an input terminal of an inverter 57. An output terminal of the inverter 57 is connected to a first input terminal of an OR gate 59. An output terminal of the NAND gate 47 is connected to a first input terminal of the NAND gate 49 and a second input terminal of a NAND gate 61. Output terminals of the NAND gates 61 and 49 are connected to first and second input terminals of a NAND gate 63, respectively. An output terminal of the NAND gate 63 is connected to a second input terminal of the OR gate 59 and a first input terminal of the NAND gate 61. The inverter 55 is connected to a first output terminal 65 of the logic section 31. An output terminal of the OR gate 59 is connected to a second output terminal 67 of the logic section 31. The output terminal of the NAND gate 63 is connected through an inverter 73 to a third output terminal 69 of the logic section 31. An output terminal of the inverter 51 is connected to a fourth output terminal 71 of the logic section 31. In this embodiment, a first input terminal of a first EX OR gate 75 is connected to the output terminal of the AND gate 45. An output terminal of the first EX OR gate 75 is connected to a second input terminal of a second EX OR gate 77. A first input terminal of the second EX OR gate 77 is connected to the output terminal of the OR gate 53. Further, an output terminal of the second EX OR gate 77 is connected to a second input terminal of a third EX OR gate 79. A first input terminal of the third EX OR gate 79 is connected to the output terminal of the NAND gate 63. An output terminal of a control signal generator 81 is connected to a second input terminal of the first EX OR gate 75. This control signal generator 81 outputs a control signal SIG at a logic level "0" or "1".

The functional test for the logic circuit with such an arrangement as described above is performed in the manner as follows. Prior to the functional test of the logic section 31, the function of a circuit (hereafter referred to as EX OR circuit 83) which is comprised of the first, second and third EX OR gates 75, 77, and 79 is tested. First, the logic level of the output signal SIG of the control signal generator 81 is inverted. When the EX OR circuit 83 is operating correctly, the logic level of an output signal S of the third EX OR gate 79 is inverted. Therefore, when the control signal SIG is inverted, it is possible to discriminate whether the EX OR circuit 83 is at fault or not by checking if the signal S is inverted or not. When the control signal SIG is inverted, if the level of the signal S is inverted also, it will be determined that the EX OR circuit 83 is not defective. On the other hand, when the control signal SIG is inverted and signal S is not inverted, it will be determined that EX OR circuit 83 shown in FIG. 4(B) is faulty.

If EX OR circuit 83 is operating correctly, predetermined test pattern signals are then input to the input terminals 33, 35, 37, and 39 of logic section 31. These pattern signals are used to detect the failure of logic section 31. Those test pattern signals may be the same signals as the conventional ones. The output signals of the first to fourth output terminals 65, 67, 69, and 71 are compared with the expected values. Further, the output signal S of the third EX OR gate 79 is compared with the expected value. By comparing the signal S with the expected value, it is possible to examine the output signals of AND gate 45, OR gate 53 and NAND gate 63 to see if they are correct or not. When the constant test pattern signals are input to logic section 31, and when the control signal S has been peset to either logic level "1" or "0", the output signals of logic section 31, the output signals of the gates 45, 53 and 63, and the output signal S all are unconditionally determined. In the case where one of the output signals of the gates 45, 53 or 63 is at the level opposite to its expected level, the output signal S likewise becomes the logic level opposite to its expected value. Therefore, by checking the output signal S, the functional test for the logic section 31 is performed. When the output signal S coincides with its expected value and the output signals from the first to fourth output terminals coincide with their expected values, it is determined that logic section 31 is not at fault. In a similar manner as above, the next test pattern signals are input the functional test is again conducted on logic section 31.

When all output signals of the logic section 31 and signal S are found to be equal to the expected values after all the test pattern signals have been input, it is determined at a minimum that logic section 31 is not faulty.

The method of performing the functional test for the circuit shown in FIG. 4(B) will now be explained by the use of a practical example. First, the voltage of the output signal SIG of the control signal generator 81 is inverted, for example, from logic level "1" to "0". Signal S is then checked, and it is inverted, the EX OR circuit 83 is not defective. The test pattern signals are input to the first to fourth input terminals 33, 35, 37, and 39 of the logic section 31. For explanation, it is assumed that the test pattern signals at the logic levels of "1", "1", "0", and "1" are input to the first to fourth input terminals 33, 35, 37, and 39, respectively. Also, it is assumed that the control signal SIG is at logic level "1". At this time, the expected values of the output signals at the first to fourth output terminals 65, 67, 69 and 71 are logic levels "0", "1", "0" and "0", respectively. The output signals at the first to fourth output terminals 65, 67, 69 and 71 are compared with the aforementioned expected values. At this time, the expected values of the output signals of AND gate 45, OR gate 53 and NAND gate 63 are at logic level "0", "1" and "1", respectively. Therefore, the expected value of the output signal S is logic level "1". The actual output signals of the first to fourth output terminals 65, 67, 69 and 71, and the actual signal S are compared with the expected values. It is now assumed that, for instance, the AND gate 45 fails and logic level "1" is output. At this time the output signals at the first to fourth output terminals 65, 67, 69 and 71 coincide with the expected values. Thus, through coinsideration of the output signals at the first to fourth output terminals 65, 67, 69, and 71 alone, it is impossible to determine that the logic section 31 is at fault. However, the signal at level "1" is input to the first input terminal of first EX OR gate 75. At the same time, signals at level "1" are respectively input to the first input terminals of the second and third EX OR gates 77 and 79. The output signal S becomes logic level "0", which is different from the expected value. Thus, it is possible to determine that logic section 31 is defective.

In the foregoing embodiment, it is possible to detect whether an odd number of signals are different from their expected values, since in this case, the output signal S is inverted, so that it is detected that a defective portion exists in the logic section 31. On the other hand, when an even number of signals are different from their expected values, the signal S is not inverted, so that the presence of a failed portion in the logic section 31 cannot be detected.

When performing the functional test for logic sectin 31, because the number of signals which can be observed is larger, the number of input test pattern signals can be reduced. In the above embodiment, in addition to the output signals from the first to fourth output terminals 65, 67, 69, and 71, it is also possible to check whether or not the output signals of the gates which constitute logic section 31 are operating correctly. Thus, this enables the number of required input test pattern signals to be reduced compared to the conventional method. If the EX OR circuit 83 is connected to the gates in which the failures are difficult to discover, the number of input test pattern signals can be reduced even further. This is so even when the logic circuit has many functions and is complex. It is also possible to realize a large reduction in the time necessary to perform the functional test even when compared to the aforementioned scan-path method. This is because it is possible to examine only the necessary number of output signals of the arbitrary gates through EX OR gate 83 in a short time.

The logic section 31 and EX OR circuit 83 may be formed on one semiconductor chip.

Figure 5:
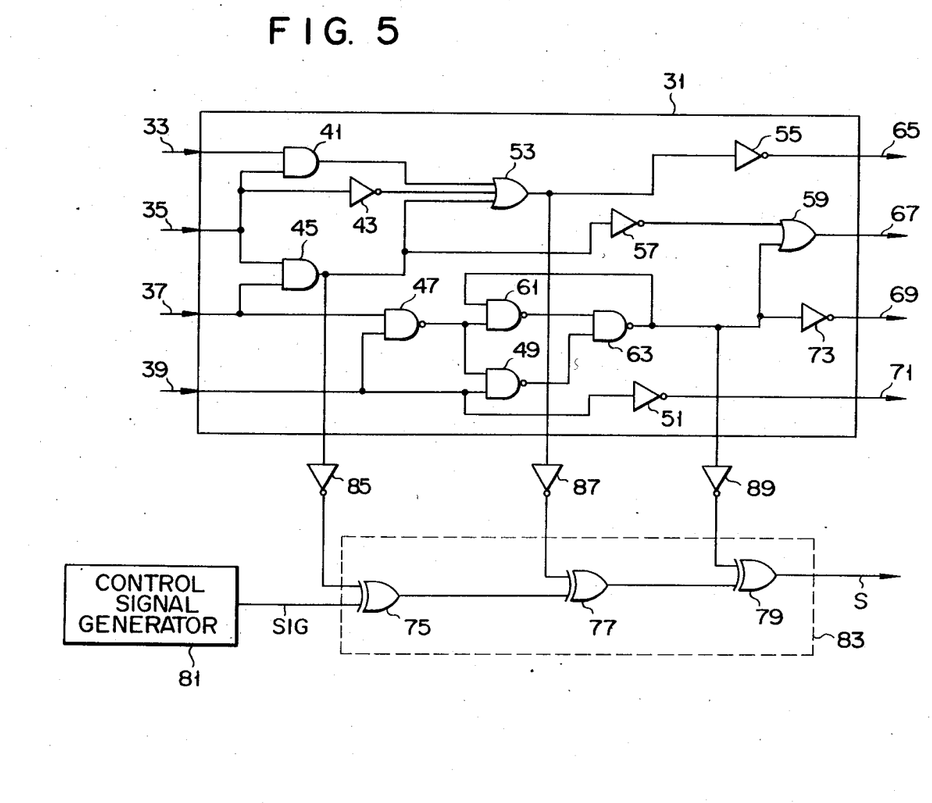
FIGS. 5 to 12 are circuit diagrams to explain other embodiments of the present invention.

FIG. 5 shows a modification of the logic circuit shown in FIG. 4(B). As shown in FIG. 5, an inverter 85 has its input terminal connected to the output terminal of an AND gate 45, and its output terminal coupled to the first input terminal of a first EX OR gate 75. An inverter 87 has its input terminal coupled to the output terminal of an OR gate 53, and its output terminal connected to the first input terminal of a second EX OR gate 77. An inverter 89 has its input terminal connected to the output terminal of a NAND gate 63 and its output terminal coupled to the first input terminal of a third EX OR gate 79. The expected value of the output signal S of the third EX OR gate 79 is the inversion of the expected value of the signal S generated by the circuit of FIG. 4(B).

Figure 6:
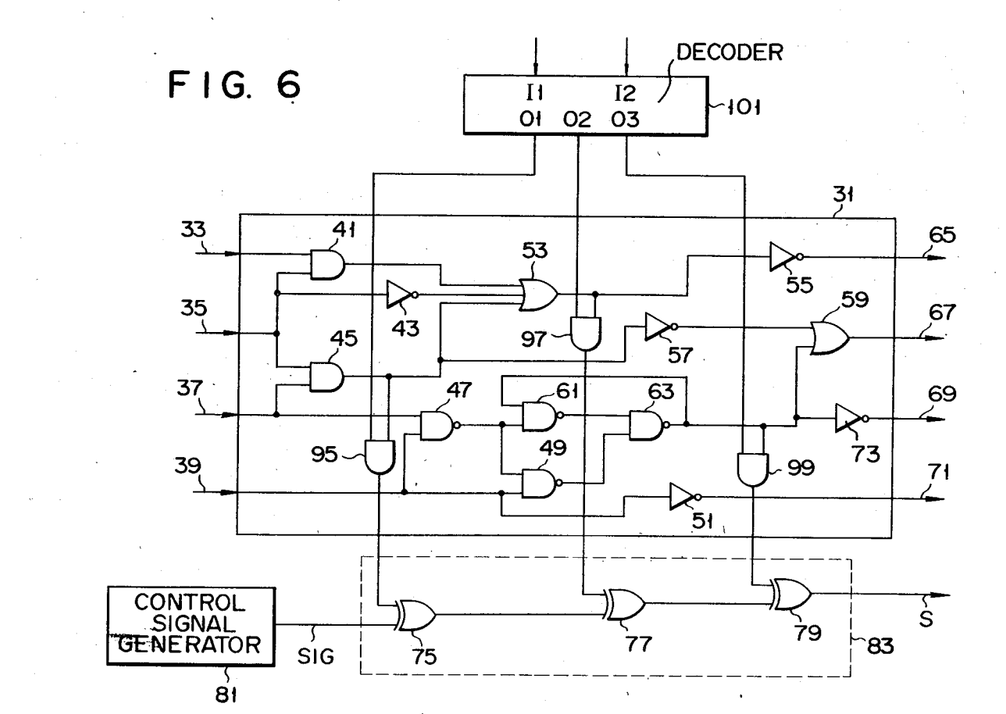

FIG. 6 is a circuit diagram showing an arrangement of a logic circuit according to another embodiment of the present invention. In addition, in FIG. 6, the parts and elements corresponding to those shown in FIG. 4(B) are designated by the same reference numerals and their descriptions will be omitted. A feature of the circuit shown in FIG. 6 is that first to third AND gates 95, 97, and 99 and a decoder 101 are provided. In FIG. 6, a first input terminal of a first AND gate 95 is connected to the output terminal of an AND gate 45. A second input terminal of the first AND gate 95 is connected to a first output terminal O1 of a decoder 101. Further, an output terminal of the first AND gate 95 is connected to the first input terminal of a first EX OR gate 75. A first input terminal of the second AND gate 97 is connected to the output terminal of an OR gate 53. A second input terminal of the second AND gate 97 is connected to a second output terminal O2 of the decoder 101. An output terminal of the second AND gate 97 is connected to the first input terminal of a second EX OR gate 77. A first input terminal of the third AND gate 99 is connected to the output terminal of a NAND gate 63. A second input terminal of the third AND gate 99 is connected to a third output terminal O3 of the decoder 101. The output terminal of the third AND gate 99 is connected to the first input terminal of a third EX OR gate 79. For example, a selection signal of two bits is input to the input terminals I1, I2 of the decoder 101. A signal at logic level "1" is output from one of the three output terminals O1 to O3 in response to this 2-bit selection signal, while signals at logic level "0" are output from the other two output terminals.

A method of performing the functional test for the logic circuit shown in FIG. 6 will now be explained.

The operation of an EX OR circuit 83 is similar to that of the circuit shown in FIG. 4(B). First, the test pattern signals are input to the first to fourth input terminals 33, 35, 37, and 39. The output signals from first to fourth output terminals 65, 67, 69, and 71 are compared with the expected values. Then, the above-mentioned selection signal is input to the input terminals I1, I2 of the decoder 101, and a signal at logic level "1" is thereby output from the first output terminal O1. This enables the first AND gate 95. The output signal of the AND gate 45 is input through the first AND gate 95 to the first input terminal of the first EX OR gate 75. At this time, the second and third AND gates 97 and 99 output signals at logic level "0". The signal S is then compared with the expected value. When the two are equal, the output signal of the AND gate 45 is determined to be correct. Otherwise, logic section 31 is determined to be defective. Next, the selection signal is switched, and, for instance, logic level "1" is output from the second output terminal O2. The output signal of the OR gate 53 is input through the second AND gate 97 to the first input terminal of the second EX OR gate 77. The signal S is compared with the expected value. Finally, the selection signal is switched to examine whether or not the output signal of the NAND gate 63 is correct. In the circuit shown in FIG. 6, the output signals of the AND gate 45, OR gate 53 and NAND gate 63 are individually checked. Therefore, even if an even number of signals (e.g., two) are simultaneously different from the correct levels, it is possible to detect whether logic section 31 is at fault. Furthermore, the defective portion of logic section 31 is immediately known and can be checked.

In the case of this embodiment, it is necessary to check the output signals of the gates 45, 53, and 63 to see if they are correct or not by changing the setting of the selection signal which is input to the decoder 101. Therefore, it takes a slightly longer time for the functional test than outlined in FIG. 4(B). However, the invention is extremely effective for a logic circuit having a high probability of a failure.

In the foregoing embodiment, the output signals of the gates 45, 53, and 63 are independently examined in accordance with the output of the decoder 101. Therefore, OR gates may be merely used in place of the EX OR gates 75, 77 and 79. This helps to reduce the size of the circuit when the number of signals needing to be checked in the logic section 31 is large since an OR gate has fewer elements than an EX OR gate. In the embodiments shown in FIGS. 4(B), 5 and 6, the output signals of the three gates 45, 53 and 63 were checked. However, the invention is not limited to this. Two, four, or more signals in the logic section 31 may be checked to see if they are operating correctly or not. The number of signals checked may be an arbitrary number. Also, the signals to be examined should be ones in which the abnormality is difficult to discover from the outside (through the output signals from the logic section 31). The number of EX OR gates constituting the EX OR circuit 83 is increased or decreased depending on the the number of signals examined.

Figure 7:
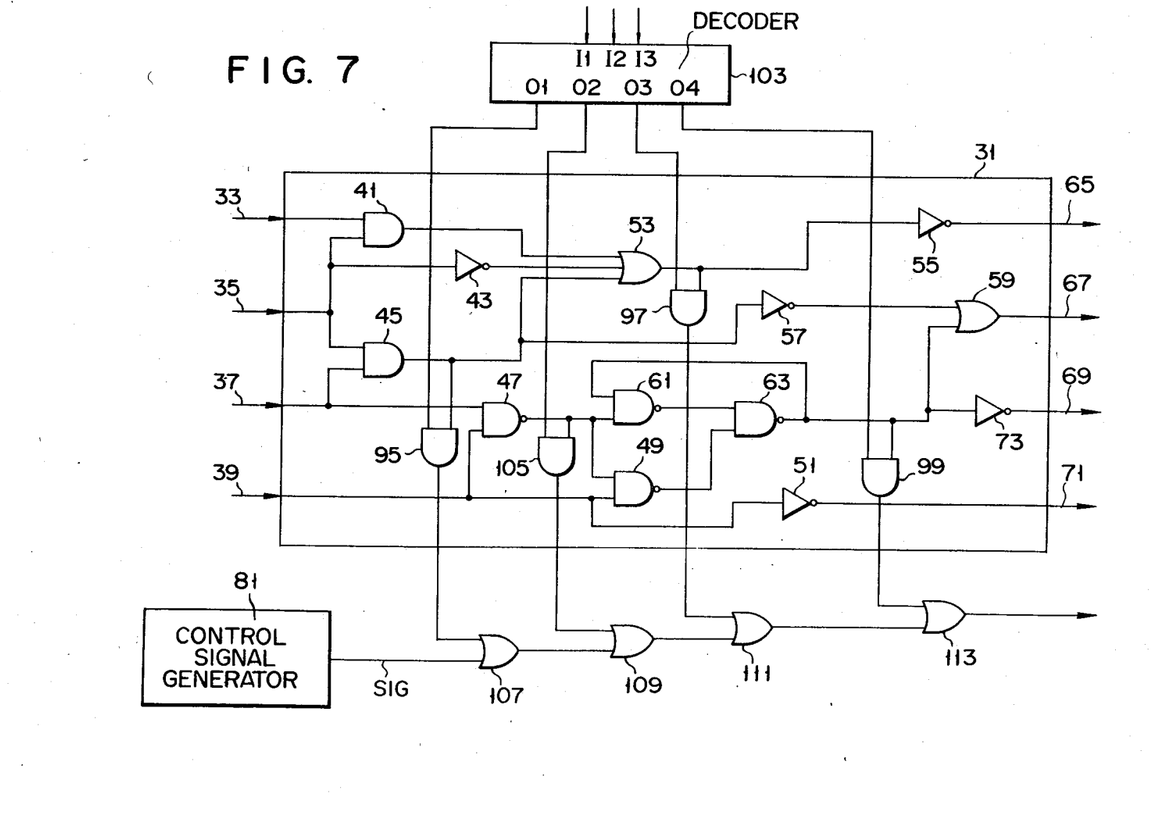

FIG. 7 shows a logic circuit according to an embodiment of the present invention where OR gates are used in place of the first to third EX OR gates 75, 77, and 79 and where four signals are checked. In FIG. 7, parts and elements also shown in FIG. 6 are designated by the same reference numerals, so their descriptions will be omitted. A decoder 103 has three inputs and four outputs. A first input terminal of a fourth AND gate 105 is connected to the output terminal of an AND gate 45. The second input terminals of first to fourth AND gates 95, 97, 99, and 105 are respectively connected to first, third, fourth, and second output terminals O1, O3, O4, and O2 of the decoder 103. The output terminals of the first to fourth AND gates 95, 97, 99, and 105 are connected to respective first input terminals of first, third, fourth, and second OR gates 107, 111, 113, and 109. The control signal generator 81 is connected to a second input terminal of the first OR gate 107. Output terminals of the first, second, and third OR gates 107, 109, and 111 are connected to second input terminals of the second, third, and fourth OR gates 109, 111, and 113, respectively. A three-bit selection signal which is input to the decoder 103 is switched and output signals of the AND gate 45, NAND gate 47, OR gate 53, and NAND gate 63 are sequentially checked to see if they are at the correct level or not by comparing the output signal of the fourth OR gate 113 with the expected value. When using the first to fourth OR gates 107, 109, 111 and 113, the control signal SIG is set to logic level "0".

Figure 8:
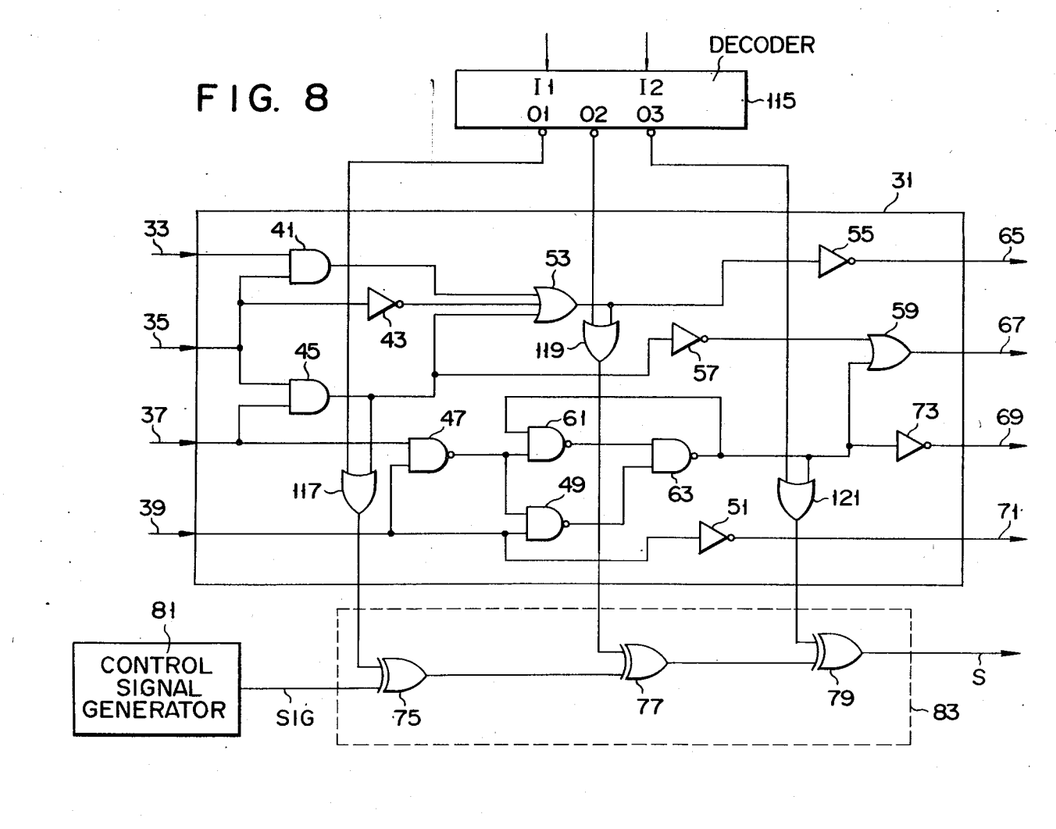

FIG. 8 shows a modification of the circuit shown in FIG. 6. The decoder 101 of the circuit of FIG. 6 is so designed as to output a signal of logic level "1" from one of the output terminals and signal of logic level "0" from the remaining two output terminals. Which output terminal supplies a "1" level signal is determined by the selection signal supplied to the decoder 101. Compared with the circuit of FIG. 6, the circuit of FIG. 8 has a decoder 115 which is designed to output a signal of logic level "0" from one of the output terminals O1 to O3 and signals of logic level "1" from the remaining two output terminals. Which output terminal supplies a "0" level signal is determined by the selection signal supplied to the decoder 115. In this circuit, OR gates 117, 119, and 121 are used in place of AND gates 95, 97, and 99 (FIG. 6). The signal from the terminal O1 is supplied to one input terminal of the a 2-input OR gate 117. The signal from the terminal O2 is suppled to one input terminal of a 2-input OR gate 119. The output signal from the terminal O3 is supplied to one input terminal of a 2-input OR gate 121. The expected value of the signal S produced by the circuit of FIG. 8 is the inversion of the expected value of the signal S output by the circuit of FIG. 6.

Figure 9:
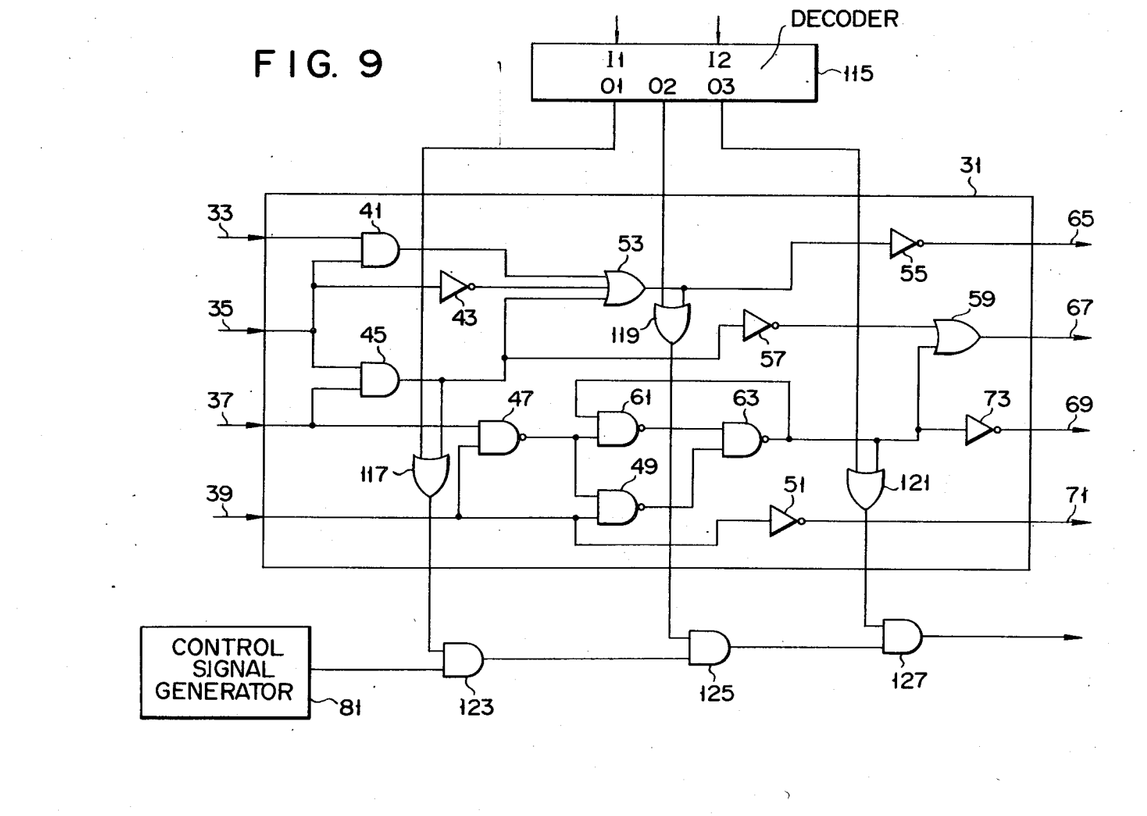

FIG. 9 shows a modification of the circuit shown in FIG. 8. This circuit uses AND gates 123, 125, and 127 instead of EX OR gates 75, 77 and 79 in the circuit shown in FIG. 8. The expected value of AND gate 127 is equal to the expected value of the signal S produced by the circuit of FIG. 6.

Figure 10:
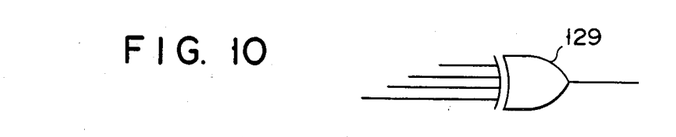
Figure 11:
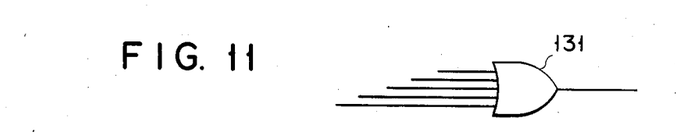
Figure 12:
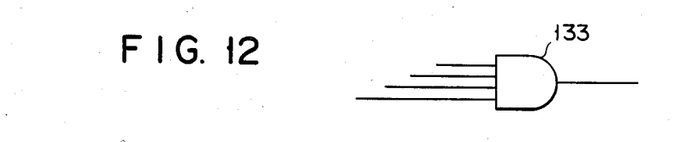

Of course, in the circuits of FIGS. 4(B), 5, 6 and 8, the EX OR gates 75, 77, and 79 may be replaced by one 4-input EX OR gate 129 as illustrated in FIG. 10. They may also be replaced by any other logic gates or a circuit which performs the same exclusive OR operation. Similarly, the OR gates 107, 109, 111, and 113 of the circuit shown in FIG. 7 may be replaced by one 5-input OR gate 131 as shown in FIG. 11. They may also be replaced by any other gates or a circuit which performs the same OR operation. Finally, the AND gates 123, 125, and 127 of the circuit shown in FIG. 9 may be replaced by one 4-input AND gate 133 as shown in FIG. 12. They may also be replaced by any other gates or a circuit which performs the same AND operation.

In the logic circuits shown in FIGS. 4(B) through 9, one arrangement of logic section 31 has been used to explain the functioning of the invention, however, the invention is not limited to this. In addition, the signals which can be checked are not limited to the aforementioned signals. This invention can be applied to any logic circuit having any arrangement. The examined signals may be arbitrarily selected, and may be the signals in which an abnormality is difficult to discover from the outside. Furthermore, the number of signals examined can be arbitrary. Therefore, according to the present invention, even when the logic circuit performs many functions and has a complicated circuit arrangement, the number of input test pattern signals can be reduced and the functional test thereof can be accurately performed in a short period of time.

What is claimed is:

1. A logic circuit comprising:
   a logic section for receiving an exterior input signal and providing an exterior output signal, said logic section including a plurality of interior logic elements having corresponding input terminals and output terminals for providing interior logic signals, said input terminals and said output terminals being interconnected to perform logic operations to generate a value for said exterior output signal according to the value of said exterior input signal; and
   a checking circuit for receiving a control signal and the values of said interior logic signals of said output terminals of selected interior logic elements, for logically combining the value of said control signal and said received values of said interior logic signals, and for generating an error detection signal having an expected value if each of said selected logic elements is operating correctly and an error value if at least one of said selected logic elements is operating incorrectly.

2. A logic circuit according to claim 1, wherein said checking circuit comprises an exclusive OR circuit having a plurality of input terminals connected to said output terminals of said selected logic elements and to said control signal, means for computing the exclusive OR of the values of said output terminals of said selected logic elements and the control signal, and means for outputting the value of said exclusive OR computation.

3. A logic circuit according to claim 2, wherein said exclusive OR circuit comprises one exclusive OR gate with a plurality of input terminals.

4. A logic circuit comprising:
   a logic section for receiving an input signal and for providing an output signal, said logic section including a plurality of logic elements having corresponding input terminals and output terminals, said input terminals and said output terminals being interconnected to perform logic operations to generate a value for said output signal according to the value of said input signal; and
   a checking circuit for receiving a control signal and the values of said output terminals of selective logic elements, for logically combining the value of said control signal and said received values, and for generating an error detection signal having an expected value if each of said selected logic elements is operating correctly and an error value if at least one of said selected logic elements is operating incorrectly, said checking circuit comprising an exclusive OR circuit having a plurality of input terminals connected to said output terminal of said selected logic elements and to said control signal, means for computing the exlusive OR of the values of said output terminals of said selected logic elements and the control signal, and means for outputting the value of said exclusive OR computation, wherein said exclusive OR circuit comprises a plurality of exclusive OR gates connected in series, each of said exclusive OR gates having a pair of corresponding input terminals and a corresponding output terminal, the output terminal of each of said exclusive OR gates being connected to one of said input terminals of the succeeding exclusive OR gate in said series, and the second input terminal of said succeeding exclusive OR gate being connected to said output terminal of one of said selected logic elements, and a first exclusive OR gate having a first input terminal connected to said control signal, a second input terminal connected to said output terminal of one of said selected logic elements, and an output terminal connected to one of said input terminals of the first exclusive OR gate in said series.

5. A logic circuit according to claim 1, wherein said logic section and said checking circuit are formed on one semiconductor chip.

6. A logic circuit according to claim 1, wherein said checking circuit further comprises means for receiving said control signal and for generating an error detection signal having an expected value if said checking circuit is operating correctly and an error value if said checking circuit is operating incorrectly.

7. A logic circuit comprising
   a logic section for receiving an input signal and for providing an output signal, said logic section including a plurality of logic elements having corresponding input terminals and output terminals, said input terminals and said output terminals being interconnected to perform logic operations to generate a value for said output signal according to the value of said input signal; and
   a checking circuit for receiving a control signal, a selection signal, and the values of said output terminals of selected logic elements, for selecting one of said received values according to the value of said selection signal, for logically combining the value of said control signal and said selected received value, and for generating an output signal having a value according to said selected received value and said control signal.

8. A logic circuit according to claim 7, wherein said checking circuit comprises:
   a decoder having a plurality of input terminals and output terminals, for receiving and decoding a selection signal on said input terminals, and generating an output signal on said output terminals with a value corresponding to the value of said selection signal;
   gates having corresponding first input, second input, and output terminals, said first input terminals of said gates being connected to different ones of said output terminals of said decoder, said second input terminals of said gates being connected to the output terminals of different ones of said selected logic elements; and a gate circuit having a plurality of gate circuits input terminals singly connected to different ones of said output terminals of said gates and to said control signal, for logically combining values received by said gate circuit input terminals, and for generating a signal with a value according to said logical combination.

9. A logic circuit according to claim 8, wherein said gate circuit comprises an OR circuit for generating a value corresponding to the logical OR of said control signal and the values generated on the output terminals of said gates.

10. A logic circuit according to claim 9, wherein said OR circuit is an OR gate with a plurality of input terminals.

11. A logic circuit according to claim 9, wherein said OR circuit comprises a plurality of OR gates connected in series, each of said OR gates having a pair of corresponding input terminals and a corresponding output terminal, the output terminal of each of said OR gates being connected to one of said input terminals of the succeeding OR gate in said series, and in the second input terminal of said succeeding OR gate being connected to said output terminal of one of said gates, and a first OR gate having a first input terminal connected to said control signal, a second input terminal connected to said output terminal of one of said gates, and an output terminal connected to one of said input terminals of the first OR gate in said series.

12. A logic circuit according to claim 8, wherein said gate circuit comprises an exclusive OR circuit for generating a value corresponding to the exclusive OR of said control signal and the values generated on the output terminals of said gates.

13. A logic circuit according to claim 12, wherein said exclusive OR circuit is an exclusive OR gate with a plurality of input terminals.

14. A logic circuit according to claim 12, wherein said exclusive OR circuit comprises a plurality of exclusive OR gates connected in series, each of said exclusive OR gates having a pair of corresponding input terminals and a corresponding output terminal, the output terminal of each of said exclusive OR gates being connected to one of said input terminals of the succeeding exclusive OR gate in said series, and the second input terminal of said succeeding exclusive OR gate being connected to said output terminal of one of said gates, and a first exclusive OR gate having a first input terminal connected to said control signal, a second input terminal connected to said output terminal of one of said gates, and an output terminal connected to one of said input terminals of the first exclusive OR gate in said series.

15. A logic circuit according to claim 8, wherein said gate circuit comprises an AND circuit for generating a value corresponding to the AND of said control signal and the values generated on the output terminals of said gates.

16. A logic circuit according to claim 15, wherein said AND circuit is an AND gate with a plurality of input terminals.

17. A logic circuit according to claim 15, wherein said AND circuit comprises a plurality of AND gates connected in series, each of said AND gates having a pair of corresponding input terminals and a corresponding output terminal, the output terminal of each of said AND gates being connected to one of said input terminals of the succeeding AND gate in said series and the second input terminal of said succeeding AND gate being connected to said output terminal of one of said gates, and a first AND gate having a first input terminal connected to said control signal, a second input terminal connected to said output terminal of one of said gates, and an output terminal connected to one of said input terminals of the first AND gate in said series.

18. A logic circuit according to claim 8, wherein said gates are AND gates.

19. A logic circuit according to claim 8, wherein said gates are OR gates.

20. A logic circuit according to claim 7, wherein said logic section and said checking circuit are formed on one semiconductor chip.

* * * * *